(12) United States Patent
Lehnert et al.

(10) Patent No.: US 11,557,505 B2
(45) Date of Patent: Jan. 17, 2023

(54) METHOD OF MANUFACTURING A TEMPLATE WAFER

(71) Applicant: Infineon Technologies AG, Neubiberg (DE)

(72) Inventors: Wolfgang Lehnert, Lintach (DE); Rudolf Berger, Regensburg (DE); Rudolf Lehner, Laaber (DE); Gerhard Metzger-Brueckl, Geisenfeld (DE); Guenther Ruhl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 161 days.

(21) Appl. No.: 17/028,503

(22) Filed: Sep. 22, 2020

(65) Prior Publication Data

US 2021/0013090 A1    Jan. 14, 2021

Related U.S. Application Data

(63) Continuation of application No. 15/659,446, filed on Jul. 25, 2017, now abandoned.

(30) Foreign Application Priority Data

Aug. 11, 2016   (DE) .................. 102016114949.7

(51) Int. Cl.
*H01L 21/762*   (2006.01)
*H01L 21/78*    (2006.01)
(Continued)

(52) U.S. Cl.
CPC .... *H01L 21/76254* (2013.01); *H01L 21/6836* (2013.01); *H01L 21/78* (2013.01);
(Continued)

(58) Field of Classification Search
CPC ....... H01L 2221/68381; H01L 21/2007; H01L 29/1608; H01L 27/76254; H01L 21/6835
See application file for complete search history.

(56) References Cited

U.S. PATENT DOCUMENTS 6,054,363 A    4/2000   Sakaguchi et al.
8,318,587 B2  11/2012   Shimomura et al.
(Continued)

FOREIGN PATENT DOCUMENTS

DE    102011054035 A1   4/2012
DE    102014110266 A1   1/2015
DE    102014118336 A1   6/2015

OTHER PUBLICATIONS

Yonehara, et al., "ELTRAN; Novel SOI Wafer, Technology," Cutting Edge 2, JSAP International, No. 4, Jul. 2001, pp. 10-16.
(Continued)

*Primary Examiner* — Samuel A Gebremariam
*Assistant Examiner* — Jonas T Beardsley
(74) *Attorney, Agent, or Firm* — Shumaker & Sieffert, P.A.

(57) ABSTRACT

A method for manufacturing a semiconductor device includes implanting gas ions in a donor wafer and bonding the donor wafer to a carrier wafer to form a compound wafer. The method also includes subjecting the compound wafer to a thermal treatment to cause separation along a delamination layer and growing an epitaxial layer on a portion of separated compound wafer to form a semiconductor device layer. The method further includes cutting the carrier wafer.

19 Claims, 7 Drawing Sheets

(51) Int. Cl.
  *H01L 21/683* (2006.01)
  *H01L 29/16* (2006.01)
  *H01L 29/20* (2006.01)
(52) U.S. Cl.
  CPC ...... *H01L 29/1608* (2013.01); *H01L 29/2003* (2013.01); *H01L 2221/6835* (2013.01); *H01L 2221/68327* (2013.01); *H01L 2221/68359* (2013.01); *H01L 2221/68377* (2013.01); *H01L 2221/68381* (2013.01)

(56) References Cited

U.S. PATENT DOCUMENTS

| | | | |
|---|---|---|---|
| 8,404,562 | B2 | 3/2013 | Berger et al. |
| 8,822,306 | B2 | 9/2014 | Berger et al. |
| 9,219,049 | B2 | 12/2015 | Berger et al. |
| 9,263,314 | B2 | 2/2016 | Puligadda et al. |
| 9,349,804 | B2 | 5/2016 | Berger et al. |
| 9,548,247 | B2 | 1/2017 | Voerckel |
| 9,576,844 | B2 | 2/2017 | Berger et al. |
| 9,704,750 | B2 | 7/2017 | Rupp et al. |
| 2005/0191779 | A1 | 9/2005 | Le Vaillant et al. |
| 2008/0014722 | A1* | 1/2008 | Park ................ H01L 21/76254 257/E21.568 |
| 2009/0072243 | A1 | 3/2009 | Suda et al. |
| 2009/0117711 | A1* | 5/2009 | Harle .................. H01L 33/0093 257/E21.002 |
| 2010/0047997 | A1 | 2/2010 | Ishizuka et al. |
| 2010/0090303 | A1* | 4/2010 | Takizawa .......... H01L 27/14601 257/E31.127 |
| 2012/0190171 | A1* | 7/2012 | Yamazaki ......... H01L 21/76254 438/455 |
| 2014/0225125 | A1 | 8/2014 | Berger et al. |
| 2015/0024550 | A1* | 1/2015 | Voerckel ................ H01L 21/56 438/127 |
| 2015/0101744 | A1 | 4/2015 | George et al. |
| 2015/0171045 | A1 | 6/2015 | Berger et al. |
| 2015/0214040 | A1* | 7/2015 | Celler ................ H01L 27/1266 438/459 |
| 2016/0260699 | A1 | 9/2016 | Lehnert et al. |
| 2017/0256442 | A1 | 9/2017 | Kweskin |
| 2018/0047619 | A1 | 2/2018 | Lehnert et al. |
| 2018/0158720 | A1* | 6/2018 | Hu .................... H01L 21/76254 |

OTHER PUBLICATIONS

Office Action, in the German language, from counterpart German Application No. 102016114949.7, dated Apr. 7, 2017, 6 pp.
Prosecution History from U.S. Appl. No. 15/659,446, dated Jan. 25, 2018 through Jun. 25, 2020, 140 pp.

\* cited by examiner

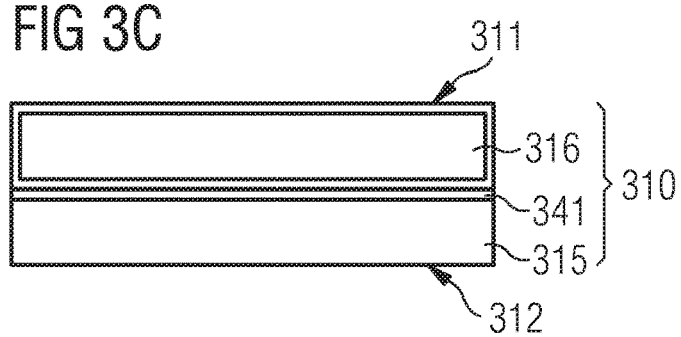
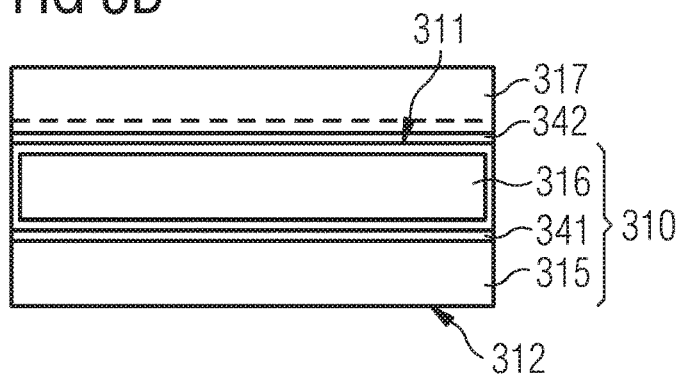
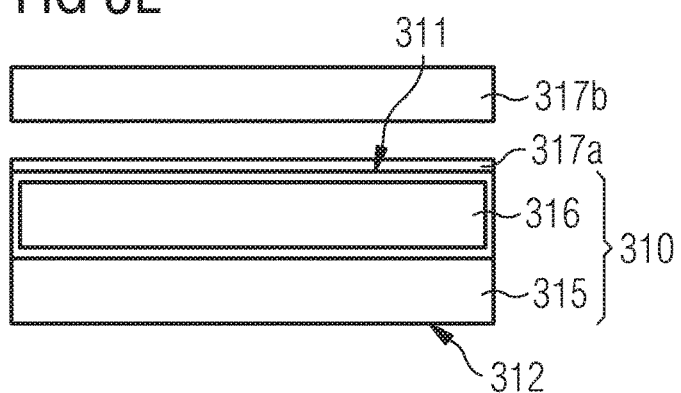

METHOD OF MANUFACTURING A TEMPLATE WAFER

METHOD OF MANUFACTURING A TEMPLATE WAFER

This application claims priority to U.S. patent application Ser. No. 15/659,446, filed on Jul. 25, 2017, and German Application 102016114949.7, filed on Aug. 11, 2016, the entire content of each of which is incorporated by reference herein.

TECHNICAL FIELD

Embodiments described herein relate to methods for manufacturing semiconductor devices having silicide layers, and to semiconductor devices such as power FETs.

BACKGROUND

Semiconductor devices are produced on wafers with a typical size of 200 mm or 300 mm diameter. Some non-silicon based semiconductors like silicon carbide, gallium arsenide or gallium nitride are either not available in such a size or are expensive in the typical wafer size of 200 mm or 300 mm diameter due to much more difficult crystal growing.

Due to smaller wafer size, non-silicon semiconductor wafers are processed in separate manufacturing lines. Alternatively, the manufacturing lines needs to be adapted in a more or less extensive way before. Both methods implicate high costs. There is therefore a desire to provide improved manufacturing processes and to reduce production costs.

SUMMARY

The above may be solved by the method of manufacturing a semiconductor device as described in the claims.

According to an embodiment, a method for manufacturing a semiconductor device includes: providing a carrier wafer comprising a first side and a second side opposite the first side; forming a semiconductor device layer on the first side of the carrier wafer to form a compound wafer comprising the semiconductor device layer and the carrier wafer; and separating the compound wafer by cutting the carrier wafer along a plane between the first side and the second side of the carrier wafer.

According to an embodiment, a method for manufacturing a semiconductor device includes: providing a carrier wafer comprising a first side and a second side opposite the first side; forming a semiconductor device layer on the first side of the carrier wafer to form a compound wafer comprising the semiconductor device layer and the carrier wafer; and separating the compound wafer by cutting the carrier wafer along a plane parallel to the first side.

According to an embodiment, a compound semiconductor wafer includes: a mechanical carrier, a separation layer on the mechanical carrier and a monocrystalline semiconductor device layer on the separation layer, wherein: the separation layer comprises graphite; the material of the monocrystalline semiconductor device layer is selected from the group consisting of SiC, GaAs, GaN, derivates thereof and combinations thereof.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference signs designate corresponding parts. In the drawings:

FIG. 3A to 3I illustrate processes of a method for manufacturing a semiconductor device according to an embodiment.

DETAILED DESCRIPTION

Figure 1A:
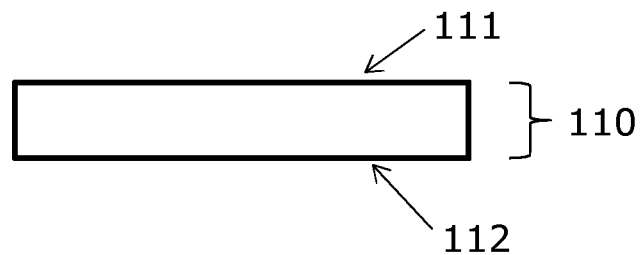
FIG. 1A to 1C illustrate processes of a method for manufacturing a semiconductor device according to an embodiment.

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second side or surface of a semiconductor substrate is considered to be formed by the lower surface or back side while a first side or first surface is considered to be formed by the top or main side or surface of the semiconductor substrate. The terms "above" and "below" as used in this specification, likewise "top" and "bottom," therefore describe a relative location of a structural feature to another structural feature with consideration of this orientation. Furthermore, spatially relative terms such as "under", "below", "lower", "over", "upper" and the like, are used for ease of description to explain the positioning of one feature relative to a second feature. These terms are intended to encompass different orientations of the device in addition to different orientations than those depicted in the Figures. Further, terms such as "first", "second", and the like, are also used to describe various features, regions, sections, etc. and are also not intended to be limiting. Like terms may refer to like features throughout the description.

Herein, a "normal projection" onto a plane or surface means a perpendicular projection onto the plane or surface. In other words, the view direction is perpendicular to the surface or plane.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

According to an embodiment, a method for manufacturing a semiconductor device includes providing a carrier wafer; and forming a semiconductor device layer on the carrier wafer. After front side processing of the semiconductor device layer, the carrier wafer is removed by cutting along a plane which is parallel to the semiconductor device layer.

Any cutting technique that allows an "in-plane" cut, i.e. a cut perpendicular to the thickness direction of the carrier wafer, can be used. Suitable cutting techniques are sawing, water jet cutting, and laser cutting. The cutting is different to the so-called smart-cut which splits a wafer along a delamination layer. The cutting as described herein may use a cutting tool to remove material by a cutting tool during cutting.

Figure 1B:
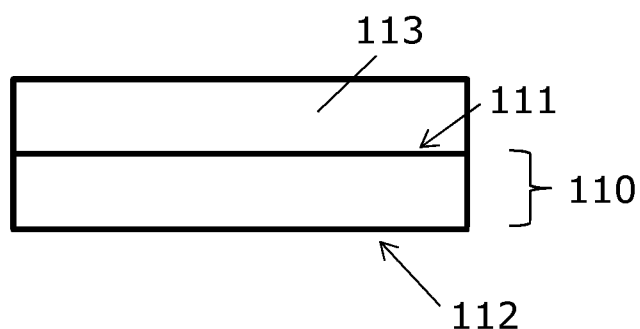
Figure 1C:
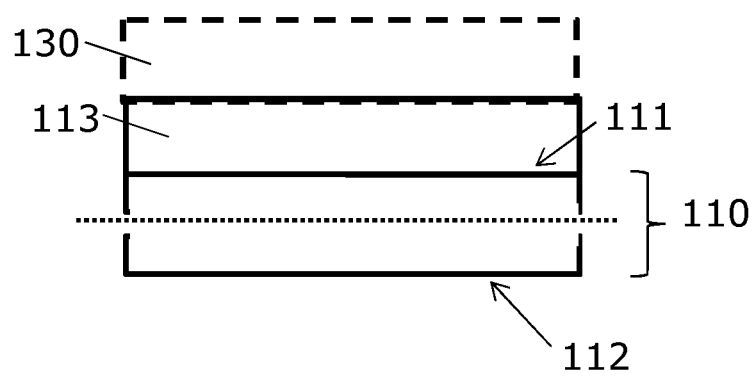

With reference to FIG. 1A to 1C, an embodiment of a method of manufacturing a semiconductor device is described.

As illustrated in FIG. 1A, a carrier wafer 110 with a first side 111 and a second side 112 opposite the first side 111 is provided. The carrier wafer can have a diameter of, for example, 100 mm, 150 mm, 200 mm or 300 mm.

In a further process, as illustrated in FIG. 1B, a semiconductor device layer 113 is formed on the first side 111 of the carrier wafer 110 to form a compound wafer. According to one or more variations of the method, the material of the semiconductor device layer 113 is selected from the group consisting of SiC, GaAs, GaN, derivates thereof and combinations thereof. Particularly the semiconductor device layer is a monocrystalline layer.

The semiconductor device layer 113 can be, for example, epitaxially grown on a thin starting layer that is bonded to the first side of the carrier wafer 110. The thin starting layer may be formed by delaminating a thin semiconductor layer from a thick wafer that is attached to the first side 111 of the carrier wafer 110. The semiconductor device layer 113 can therefore include the thin starting layer and an epitaxial layer formed on the thin starting layer. The above delamination may also be referred to as smart-cut.

Alternatively, the semiconductor device layer 113 can be formed to have a thickness that substantially corresponds to the final device thickness of a semiconductor device that is to be integrated in the semiconductor device layer 113. For example, the semiconductor device layer 113 can have a thickness between 1 µm and 130 µm, particularly between 5 µm and 20 µm.

In relation to its diameter, the semiconductor device layer 113 would be too thin to be mechanically stable enough for handling during the manufacturing processes. Therefore, the semiconductor device layer 113 is supported and attached to the carrier wafer 110 which provides, together with the semiconductor device layer 113, sufficient stability for the compound wafer.

The carrier wafer 110 can have substantially the same thickness as the semiconductor device layer 113. Alternatively, the carrier wafer 110 can have a thickness which is larger than the thickness of the semiconductor device layer 113. Typically, the carrier wafer 110 is thicker than the semiconductor device layer 113. The thickness of the carrier wafer 110 is typically adjusted such that the total thickness of the carrier wafer 110 and of the semiconductor device layer 113, i.e. of the compound wafer, corresponds to the thickness that is usually used for semiconductor wafers so that the compound wafer can be processed with standard equipment. The total thickness can be, for example, between 250 µm and 1000 µm, and particularly between 500 µm and 800 µm.

According to an embodiment, the carrier wafer 110 and the semiconductor device layer 113 are comprised of different material. For example, the carrier wafer 110 can be formed from a material that is mechanically less rigid or has a hardness which is less than the hardness of the semiconductor device layer 113. The material of the carrier wafer 110 can be selected so that the carrier wafer 110, in comparison to the semiconductor device layer 113, can be more easily mechanically processed, in particularly cut.

An example of a suitable material for the carrier wafer 110 is carbon or other carbon-based inorganic material that can withstand high process temperatures occurring during manufacturing of the semiconductor devices but which is soft enough to be mechanically processed without damaging the semiconductor device layer 113. An example material for the carrier wafer 110 is graphite.

The embodiment of FIGS. 1A to 1C uses a "thick" carrier wafer 110 substantially made of a single material that will later be cut along a plane parallel to the semiconductor device layer 113.

If needed, the carrier wafer 110 can be at least partially encapsulated so that the base material of the carrier wafer 110 is not exposed and is protected.

According to one or more embodiments, the semiconductor device layer 113 can further include, or provided with, for example, one or more doping regions, insulating layers, metallization layers or front side contacts, to form lateral or vertical semiconductor devices such as diodes, transistors, different variations of FETs, IGBTs or other semiconductor devices.

For example, at least one doping region, typically a plurality of doping regions can be formed in the semiconductor device layer 113 after the semiconductor layer 113 is formed on the first side 111 of the carrier wafer 110. The one or the plurality of semiconductor regions form one or respective pn-junctions in the semiconductor device layer 113.

In addition to that or alternatively, a metallization layer can be formed on a side of the semiconductor device layer 113 which is opposite to the side facing the carrier wafer 110. The metallization layer can be in ohmic contact with the at least one doping region. Typically, the metallization layer is formed after the semiconductor device layer 113 is formed and before the carrier wafer 110 is cut.

In the further process, as illustrated in FIG. 1C, the carrier wafer 110 is cut between the first side 111 of the carrier wafer 110 and the second side 112 of the carrier wafer 110. This can be done with a cutting tool for example by cutting, sawing, laser cutting or water jet cutting. Remaining material of the carrier wafer 110 on the semiconductor device layer 113 can be removed by, for example, grinding or etching or a combination thereof.

According to an embodiment, the carrier wafer is cut along a plane that is parallel to the interface plane between the semiconductor device layer 113 and the carrier wafer 110. Cutting the carrier wafer 110 along such a plane allows removal of most of the material of carrier wafer with a cutting tool in short time in comparison to processes which remove the material of the carrier wafer starting from the second side 112 of the carrier wafer 110 and which processes advances in thickness direction of the carrier wafer 110. The cutting as described herein advances in a direction perpendicular to the thickness direction.

The "cutting plane" is typically arranged between the second side 112 and the first side 111 of the carrier wafer 110 and typically arranged closer to the first side than to the second side 112 to remove most of the material of the carrier wafer from the semiconductor device layer 113.

During cutting, the semiconductor device layer 113 can be optionally supported by a carrier 130 which can be temporarily attached to the side of the semiconductor device layer 113 which side faces away from the carrier wafer 110. The carrier 130 can be releasably attached to the semiconductor device layer 113 by using an adhesive, for example.

Since the carrier wafer 110 is cut along the plane between the first 112 and the second side 111 of the carrier wafer 110 any attachment methods between the carrier wafer 110 and the semiconductor device 113 can be used which can withstand very high process temperatures. During processing of the semiconductor device layer 113 to diffuse dopants and/or to thermally grow an oxide on exposed regions of the semiconductor device layer 113, very high process temperatures are employed. The bond between the carrier wafer 110 and the semiconductor device layer 113 should not be affected by these high process temperatures to ensure a reliable bond and mechanical support of the semiconductor device layer 113.

For example, processing SiC as material of the semiconductor device layer 113 may include heating the semiconductor device layer 113 and the carrier wafer 110 to temperatures of up to 1700° C. or even up to 1850° C. At such temperatures, any reversal or reversible bonds would fail and would lead to a delamination of the semiconductor device layer 113. Hence, permanent bonds are needed, which, however, do not allow a reversal detachment of the carrier wafer 110 without damaging the carrier wafer 110 or the semiconductor device layer 113 or both. Therefore, carrier wafers which are bonded to a semiconductor device layer are typically removed by time-consuming grinding or etching or other methods that processes the backside, i.e. the exposed backside of the carrier wafer. The material of the carrier wafer is in those methods removed from the backside.

Different to such methods, the carrier wafer 110 is cut along a plane which is parallel to the first side 111 and the second side 112. The cutting plane is spaced from the first side 111 so that the semiconductor device layer 113 is not damaged during cutting. The cutting can be described to start at an edge of the carrier wafer 110 and advances in a direction perpendicular to the thickness direction of the carrier wafer 110. This approach allows using processes which cut the carrier wafer 110, and thus remove material, in shorter time than it would be required for conventional methods that etch or grind in thickness direction.

Furthermore, the cutting typically does not affect the bonding interface between the carrier wafer 110 and the semiconductor device layer 113 so that the cutting tool only advances through a single material. This reduces wear of the cutting tool and allows selecting a cutting tool which is best adapted for the material of the carrier wafer 110.

The remaining material of the carrier wafer 110 which remains attached to the semiconductor device layer 113 can be subsequently removed, for example by etching and/or grinding.

In view of the above, a method for manufacturing a semiconductor device includes providing a carrier wafer 110; and forming a semiconductor device layer 113 on the carrier wafer 110. After front side processing of the semiconductor device layer 113, the carrier wafer 110 is removed by cutting along a plane which is parallel to the semiconductor device layer 113.

Figure 2A:
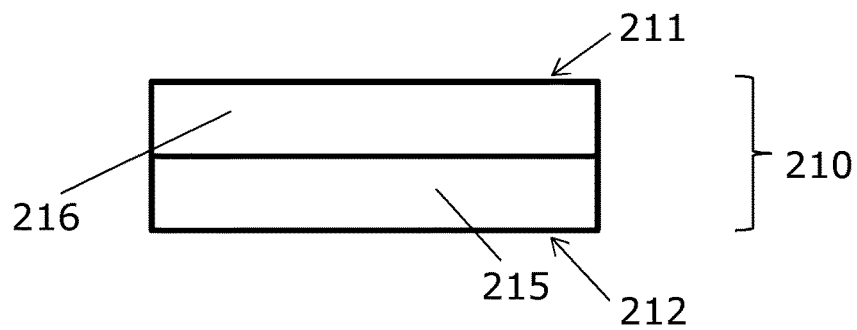
FIG. 2A to 2F illustrate processes of a method for manufacturing a semiconductor device according to an embodiment.

With reference to FIG. 2A to 2F, another embodiment of the method of manufacturing a semiconductor device is illustrated. In FIG. 2A a carrier wafer 210 having a first side 211 and a second side 212 opposite the first side 211 is illustrated. The carrier wafer 210 includes a mechanical carrier 215 and a separation layer 216. The carrier wafer 210 thus includes at least two layers which are typically made of different material.

The mechanical carrier 215 and the separation layer 216 serve different purposes. The separation layer 216 is typically mechanically or chemically less stable than the mechanical carrier 215. The cutting is typically carried out along the separation layer 216 without affecting the mechanical carrier 215 and the semiconductor device layer 213.

The material of the separation layer 216 can be selected depending on the cutting tool that is used for cutting. The separation layer 216 can, for example, include carbon, for example graphite, or another material which is easy to cut by mechanical cutting or laser cutting without or in combination with oxygen.

According to one or more embodiments of the method, the mechanical carrier 215 can be selected from a monocrystalline material, a polycrystalline material, and an amorphous material, mixtures thereof and can optionally be comprised of the same material as the semiconductor device layer 213 to be formed on the separation layer 216 to have the same coefficient of thermal expansion (CTE) and thus to reduce thermal stress. Furthermore, using the same material for the mechanical carrier 215 reduces contamination of the semiconductor device layer 213 during processing. The mechanical carrier 215 provides mechanical stability of the wafer during processing.

The separation layer 216 can be a single layer. Alternatively, the separation layer 216 can include two or more layers of the same or of different material. Since the main purpose of separation layer 216 is to provide a material layer that can be easily cut, any material can be used which is softer and more easily mechanically processible than the mechanical carrier.

According to an embodiment, the separation layer 216 and the mechanical carrier 215 are separately provided and then bonded which each other to form the carrier wafer 210. Alternatively, the separation layer 216 can be formed on the mechanical carrier 215.

The mechanical carrier 215 and the separation layer 216 can be bonded by at least one of pre-ceramic polymer bonding e.g. allyl-hydrido-polycarbosilane, glue, and thermic bond depending on further processing steps especially temperature treatments. These bonding processes form permanent bonds which can withstand high process temperatures during processing of the semiconductor device layer 213.

The separation layer 216 can be encapsulated by a protection layer, particularly by an oxygen-tight protection layer. The separation layer 216 can further be grinded, polished or coated prior to forming the semiconductor device layer 213 to improve bonding properties or mechanical stability or chemical stability. The protection layer 216 can be an electrically conductive protection layer. Alternatively, the protection layer 216 can be an electrically insulating protection layer.

According to one or more embodiments of the method, the stress and bow of the compound wafer during heat treatments is reduced by adapting the thickness of the separation layer 216 and the thickness of the mechanical carrier 215.

Figure 2B:
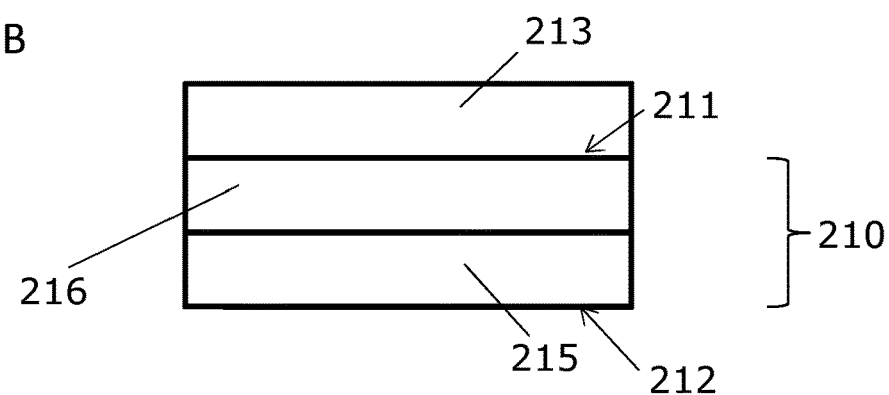

With reference to FIG. 2B, the semiconductor device layer 213 is formed on the first side 211 of the carrier wafer 210 to form the compound wafer, wherein the separation layer 216 is arranged between the mechanical carrier 215 and the semiconductor device layer 213. The semiconductor device layer 213 and the carrier wafer that includes the mechanical carrier 215 and the separation layer 216 thus form the compound wafer which is subjected to several high temperature processes during manufacturing of semiconductor devices in the semiconductor device layer 213.

According to one or more embodiments of the method, the compound wafer is subjected to a temperature treatment of up to 900° C. or even up to 1200° C., and even more such as between 1300° C. and 1850° C. The material of the mechanical carrier 215 is typically adapted to the material of the semiconductor device layer 213 to reduce mismatches of mechanical properties such as differences in thermal expansion coefficients during heat treatments and resulting deformation of the wafer or stress in the wafer.

According to an embodiment, the semiconductor device layer 213 is made of GaN, and the compound wafer with a GaN semiconductor device layer 213 is subjected to a thermal treatment at a temperature up to 900° C. to form a doping region.

According to an embodiment, the semiconductor device layer 213 is made of SiC, and the compound wafer with a SiC semiconductor device layer 213 is subjected to a thermal treatment at a temperature of higher than 1300° C. to form a doping region or to form an oxide layer by thermal oxidation. Bond connections based on oxidic bond interfaces are typically only stable up to 1300° C. However, bond interfaces based on Pre-ceramic-polymer bonding, as described below, can withstand very high temperatures and thus are particularly attractive for SiC devices.

Stress and bow of the compound wafer can be adjusted by thickness adaptation of the mechanical carrier 215 and the separation layer 216. In addition to that or alternatively, the material of the separation layer 216 can be selected such that the separation layer 216 provides a "buffer" for the thermal mismatch or to relieve the mechanical stress that may occur during later processing.

The material for the separation layer 216 can be optimized for good bonding and separation. It is not needed to optimize the material of the separation layer 216 to have mechanical and thermal properties which are similar or nearly identical to those of the semiconductor device layer 213. Therefore, inexpensive materials such as carbon or graphite can be used.

The thickness of separation layer 216 can be optimized relative to the cutting method that is later carried out. In particularly a cutting with an inner diameter saw is possible, because the separation layer 216 can be sawn easily when using carbon or graphite as material for the separation layer 216.

Since only the separation layer 216 is consumed during cutting, the mechanical carrier 215 is not damaged and can be reused. This is particularly beneficial as the mechanical carrier 215 is typically made of the same material as the semiconductor device layer 213.

Material of the mechanical carrier can be the same material as for semiconductor device layer 213 or can be of any other semiconductor material that is mechanically and chemically sufficiently stable for the processes carried out during processing of the semiconductor devices.

In addition to that, using the same material eliminates concerns of contamination to handlings tools and/or process equipment as the exposed backside of the compound wafer presents the same semiconductor material as the semiconductor device layer 213. If needed, the lateral edges of the separation layer 216 can be covered by an inert material such as a silicon nitride to prevent contamination with the material of the separation layer 216.

A sealing of the separation layer's backside, i.e. the side facing the mechanical carrier 215, against any chemical or mechanical attack is not needed as protection is provided by the mechanical carrier 216.

Figure 2C:
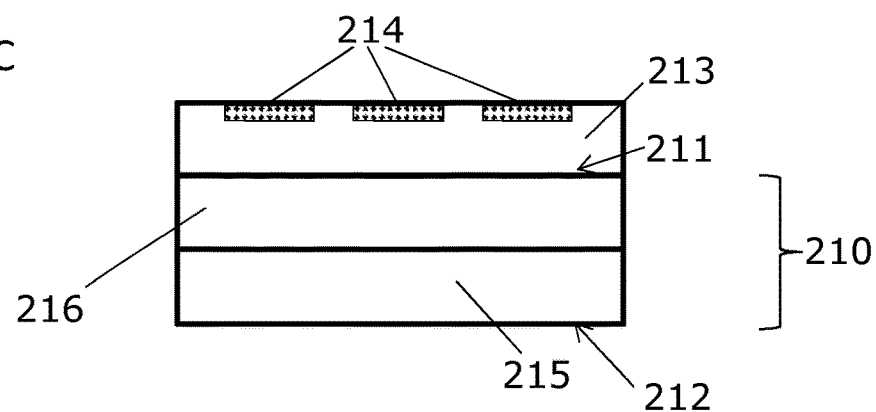

In FIG. 2C, forming of one or more doping regions 214 in the semiconductor device layer 213 is illustrated. The doping regions 214 are formed in the semiconductor device layer 213 typically at the exposed side facing away from the carrier wafer 210. Different doping regions can be of different types of conductivity, and the initially provided or formed semiconductor device layer 213 can be completely of a single type of conductivity. Typically, the doping-type of the one or more doping regions depends on the intended semiconductor device such as diodes, transistors, different variations of FETs, IGBTs or other lateral or vertical semiconductor devices.

It is also possible to form a doping region in the semiconductor device layer 213 at a side facing the mechanical carrier 215. Since this side later forms a backside of the semiconductor devices, a doping formed on that side facilitates electrical contact with a metal layer. The doping region can be formed, for example, prior to attaching the semiconductor device layer 213 to the separation layer 216.

Figure 2D:
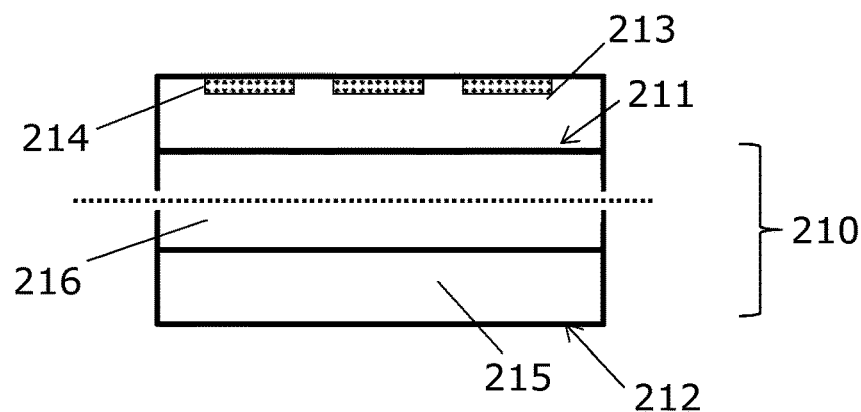

In FIG. 2D, the carrier wafer 210 is cut between its first side 211 and its second side 212. The cutting includes cutting the separation layer 216 along its extension, i.e. along a plane that is between and parallel to the semiconductor device layer 213 and the mechanical carrier 215. The cutting is preferably done in a way that it neither damages the mechanical carrier 215 nor the semiconductor device layer 213. The thickness of the separation layer is therefore chosen depending on the cutting tool and preferably in the range of 150 µm to 500 µm or more, and particularly in the range of 250 µm to 400 µm. Typically, the thickness of the separation layer 216 is larger than the thickness of the cutting tool to provide for sufficient space for the cutting tool. The thickness of the cut, depending on the used cutting tool, can be between 150 mm and 500 µm.

According to an embodiment, the cutting is carried out in an oxidising atmosphere to support removal of graphite or carbon. During advance of the cutting, new material of the separation layer 216 is presented which partially oxidizes so that the cutting can advance even faster.

Remaining graphite or carbon can be removed subsequently by ashing.

According to one or more embodiments of the method, the mechanical carrier 215 is preferably not damaged and therefore preserved. It can comprise expensive material such as monocrystalline or polycrystalline SiC, GaAs, GaN, derivates of them and combinations of them and particularly the same material as the semiconductor device layer 213. The separation layer 216 comprises mainly inexpensive material compared to the material of the semiconductor device layer 213 and compared to the mechanical carrier 215. Cutting the separation layer 216, 316 with preserving the mechanical carrier 215 generates a cost benefit compared to other manufacturing processes, in which carrier wafers are removed by destroying them with grinding or etching.

Figure 2E:
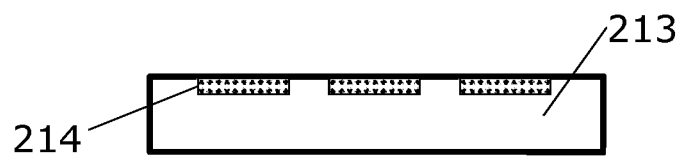

In FIG. 2E, the semiconductor device layer 213 is illustrated after removing of remaining material of the separation layer 216 that remained attached to the semiconductor device layer 213 by, for example, grinding or etching or a combination thereof. Since only remaining material of the separation layer 216 needs to be removed by grinding or etching processes, only a little process time is added. Even in combination with the time needed for cutting, the total process time to completely remove the carrier wafer 210 can be shorter than the time needed to remove a carrier wafer by conventional methods.

As described in connection with FIG. 1C, a carrier can be temporarily attached to the semiconductor device layer 213 for mechanical support. As no high temperature processes are carried out, a reversal and inexpensive bond can be used.

Figure 2F:
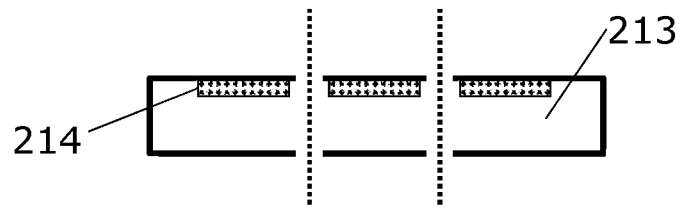

The semiconductor device layer 213 in a form of a wafer can be finally diced in semiconductor chips as illustrated in FIG. 2F. Dicing is typically carried out after fully integration of all doping regions and formation of a front side metallization. Dicing occurs, different to the cutting, in thickness direction.

Optionally, a backside metallization can be formed after removal of the carrier wafer 210 and prior to dicing. When a conductive material, such as graphite or carbon, is used for the separation layer 216, the separation layer 216 does not need to be fully removed prior to forming the backside metallization as graphite or carbon is conductive and can assist in providing a good ohmic contact.

Alternatively, respective backside metallizations can be formed after dicing on each of the semiconductor chips.

In view of the above, a compound wafer forming a sandwich that disposes a separation layer 216 between a mechanical carrier 215 and a semiconductor device layer 213 is provided. The "outer" layers of the sandwich can each be monocrystalline material with the "middle" layer, i.e. the layer that is sandwiched between the outer layers can be a polycrystalline or an amorphous layer. The middle layer is made of a material that is softer and can be more easily mechanically removed that the material of the outer layers.

The compound wafer can include a carrier material which forms and acts as "thick" separation layer. The material of the separation layer can be easily removed by e.g. cutting and/or etching/grinding, without damage to the semiconductor device layer 213 and the mechanical carrier 215. The mechanical carrier 215 is mainly responsible for mechanical stiffness and may have the same or similar mechanical properties as the semiconductor device layer 213, or it is made of the same material. The mechanical carrier 215 can be reused and, therefore, a material can be selected which can be tailored with respect to mechanical, chemical and thermal properties even if this material is expensive.

As described above, bond interfaces which are suitable for high temperature processing cannot be separated by conventional processes in semiconductor manufacturing without destroying the carrier (e.g. bonding monocrystalline SiC layers on poly-crystalline SiC wafers). To avoid damage of a mechanical carrier, the separation layer made of a different material is provided. This provides a cost benefit and allows separate tailoring of the material properties.

With reference to FIG. 3A to 3I, another embodiment of the method of manufacturing a semiconductor device is illustrated.

In FIG. 3A to 3C a separation layer 316 is provided. The separation layer 316 can be prepared for bonding to the mechanical carrier 315, for example, by adapting the surface properties and the bonding conditions. For example, the separation layer 316 can be encapsulated with a protection layer 340, particularly by an oxygen-tight protection layer or by polishing or grinding the surface of the separation layer 316 or a combination thereof.

In a specific embodiment, the separation layer 316 is a carbon wafer that can be encapsulated by an oxygen-tight encapsulation or protection layer 340 such as silicon nitride layer. Although during later processes a protection at the side edges, i.e. along the lateral rim of the carbon wafer 316 is only needed, the encapsulation or protection layer 340 is typically formed at all faces of the carbon wafer 316.

Graphite or carbon wafers are commercially available. For illustration purposes, the carrier wafer can be about 400 μm thick and may have a thickness in a range between 300 μm and 800 μm. The thickness can be adjusted so that only the carbon wafer is cut as is described later.

A mechanical carrier 315 is provided and subsequently bonded to the separation layer 316 to form the carrier wafer 310. Any suitable bonding process can be used, with bonding processes that provide thermally stable bonds, such as bonds which are thermally stable up to at least 800° C., more particularly up to at least 1000° C., and more particularly up to at least 1200° C. being particularly selected.

According to an embodiment, a first bonding layer 341 is formed on the mechanical carrier 315 or on the separation layer 316. Alternatively, respective first bonding layers can be formed on each of the mechanical carrier 315 and the separation layer 316. Formation of the first bonding layer 341 is optional. For example, the protection layer 340 may function as bonding layer as well so that an additional bonding layer is not needed.

Typically, the first bonding layer 341 is formed in addition to the protection layer 340, either on the protection layer 340 or on the mechanical carrier 315, or on both. The first bonding layer 341 can include a plurality of different intermediate layers. If the mechanical carrier 315 is made of SiC and the separation layer 316 is made of graphite or carbon, the first bonding layer 341 can contain reaction products of a carbide- and silicide-forming metal with the SiC mechanical carrier 315 and the carbon separation layer 316, e.g. at least one carbide phase and/or at least one silicide phase. For example, in the case of the carbide- and silicide-forming metal used for the first bonding layer 341 being Mo, the phases may include one or more of MoCSi, MoSi, and MoC phases. Generally, these phases can be obtained by only moderately heating the silicon carbide mechanical carrier 341 (to less than 700° C., e.g. in the range 500-700° C.), and the resulting carbide phase and/or silicide phase are nevertheless generally highly temperature resistant and well-suited to the further processing steps and working conditions even at high temperature.

The formation of a bonding layer using a carbide and silicide-forming metal is described in more detail in US 2014/0225125 A1 which is hereby incorporated as reference.

According to a further embodiment, the first bonding layer 341 can be an electrically insulating layer, for example a silicon oxide layer which also facilitates bonding to the carrier wafer 310.

According to a further embodiment, the first bonding layer 341 is an adhesive bonding layer or a glue bonding layer. The adhesive bonding layer 341 can be formed by using a polymer or a ceramic-forming polymer such as a SiC-ceramic forming polymer precursor, for example an organic adhesion precursors. The SiC-ceramic first bonding layer 341 can be polycrystalline. A specific example of a SiC-ceramic forming polymer precursor is a carbosilane such as allyl-hydrido-polycarbosilane, which is particularly useful for bonding silicon carbide to carbon. Such a bond may be referred to as AHPCS bond. This SiC-ceramic forming polymer precursor allows adhesive bonding and, in addition, is converted during bonding by pyrolization at high temperature to polycrystalline silicon carbide. The first bonding layer 341 thus becomes a SiC layer which minimizes mechanical stress due to CTE mismatch and ensures a low-ohmic connection between the silicon carbide mechanical carrier 315 and the carbon material of the separation layer 316.

The formation of an adhesive bond by using, for example, a bonding layer formed from a SiC-ceramic forming polymer precursor is explained in more detail in US 2015/0171045 A1 and DE 10 2014 118 336 A1 which are hereby incorporated by reference.

Another possible option is thermic bonding. Thermic bonding employs a material which is liquefied, for example by heat or ultra-sonic, to form a bond. A thermic bond may be disintegrated upon applying of heat so that certain thermic bonds are not stable enough for high thermal treatment. Therefore, thermic bonding materials are used which withstand high temperatures after bonding. For example, when the bond material undergoes a chemical reaction with the material to be bonded, more stable bonds can be obtained. An example are solders which form stable intermetallic alloys with semiconductor material.

Different processes can be used for bonding. Examples are adhesive bonding using an adhesive bonding layer, reactive bonding, or diffusion bonding. Reactive bonding can also include formation of a thin metal layer on either or on each of the silicon carbide mechanical carrier 315 and the separation layer 316, respectively. During thermal treatment, the deposited metal reacts with the silicon carbide and the material, such as carbon, of the separation layer 316.

With reference to FIGS. 3D and 3E, a monocrystalline semiconductor donor wafer 317 is provided. The donor wafer 317 has a first side and a second side arranged opposite the first side. Gas ions (e.g. protons) can be implanted into the second side of the donor wafer to form a delamination layer at a predefined depth in the donor wafer 317. The delamination layer is indicated in FIG. 3D by a dashed line. According to one or more embodiments, the delamination layer can be formed by a micro-bubble layer or micro-porous layer. The first side of the donor wafer 317 is the side that will be bonded to the carrier wafer 310, i.e. to the separation layer 316.

More specifically, gas ions such as protons are implanted into the first side of donor wafer 317 into a given depth. The implantation depth can be adjusted by selecting the implantation energy. The implantation depth defines a thickness d of a starting layer 317a, when an epitaxial layer is subsequently formed on the starting layer, or of the final semiconductor device layer if no additional epitaxial deposition is carried out. The implantation of gas atoms or gas ions (e.g. protons), respectively, causes the formation of a delamination layer (dashed line) which can be a micro-bubble layer or micro-porous layer along which the donor wafer 317 is delaminated by a later process. The thickness d of the starting layer 317a can be, for example, between 200 nm and 3000 nm. A specific example is 1 µm.

Alternatively, the donor wafer 317 can already be provided with a thin H+ implanted layer 317 that forms the delamination layer.

The side of the donor wafer 317 which is subsequently bonded to the separation layer 316 can include a doping region. Alternatively, a doping region to provide a low ohmic connection to a later formed backside metallization can be formed prior to or after the implantation of the gas atoms to form the delamination layer.

In a further process, the donor wafer 317 including the delamination layer is bonded on the separation layer 316 on the first side 311 of the carrier wafer 310. According to an embodiment, any of the above described bond processes can be used. Typically, a second bonding layer 342 is formed on the donor wafer 317 or on the separation layer 316 of the carrier wafer 310, or on both. According to an embodiment, AHPCS bonding is used. In a further process, as illustrated in 3E, compound wafer, which includes the carrier wafer 310 and the donor wafer 317 bonded to the carrier wafer 310, is subjected to a thermal treatment to delaminate the donor wafer 317 along the delamination layer which serves as a cleavage plane. The thermal treatment causes mechanical tensions which results in a separation along the delamination layer. A comparably thin semiconductor layer 317a (the starting layer) remains bonded to the carrier wafer 310 through the second bonding layer. Semiconductor layer 317a has a thickness d which was defined by the implantation energy of the gas ions.

The delamination process leads to the formation of a part-wafer 317b, or a remaining wafer, which can be used again for manufacturing further starting layers of other compound wafers. This is very cost-efficient and is particularly of interest for SiC. Part-wafer 317b can be polished before reuse. The thermal treatment can also refer to as debonding anneal.

The compound wafer includes the monocrystalline semiconductor layer 317a which remains attached to the separation layer 316. The semiconductor layer 317a, which is also referred to as starting layer, which was detached from donor wafer 317 by the delamination process, includes a cleavage surface which can be polished if desired.

By removing the upper part donor wafer 317 along its delamination region the starting layer 317a remains bonded on the carrier wafer 310.

The delamination process as described herein is also attractive for power devices on the basis of SiC. Examples are diodes, J-FETs, IGBTs, MOSFETs, SiC-SOI devices etc. The process starts with providing a SiC donor wafer and formation of an optional bonding layer which can be insulating or electrically conducting. After delamination, the SiC donor wafer 317 can be reused several times, wherein each time the donor wafer has been used its thickness is reduced by the amount corresponding to the thickness of the starting layer 317a which remains attached to the carrier wafer 310. After delamination, the surface of the SiC donor wafer 317 can be polished before reuse. The starting layer 317a which remains attached to the carrier wafer 310 can also be polished.

According to one or more embodiments of the method, an epitaxial layer 313a is grown on the starting layer 317a. Typically, the material of the donor wafer 317 is the same material as that of the epitaxial layer 313a, so that the starting layer 317a and the grown epitaxial layer 313a are of the same material. The epitaxial layer 313a and the starting layer 317a are forming together the semiconductor device layer 313.

According to one or more embodiments of the method, the donor wafer 317 comprises a monocrystalline structure that allows epitaxial growth of the epitaxial layer 313a without or with low stress and number of dislocations. Particularly the donor wafer 317 comprises the same material and crystal structure as the epitaxial layer 313a and as the semiconductor device layer 313. The starting layer 317a that remains bonded on the carrier wafer 310 and the epitaxial layer 313a form together the semiconductor device layer 313.

According to an embodiment, the epitaxial layer 313a can be formed on the thin starting layer 317a detached from the donor wafer to tailor, for example, the doping concentration of the semiconductor device layer 313.

The epitaxial layer 313a can have a thickness between about 5 µm and 20 µm. The thickness of the epitaxial layer 313a can also be larger than 20 µm depending on the rated blocking voltage of the final semiconductor device.

Figure 3F:
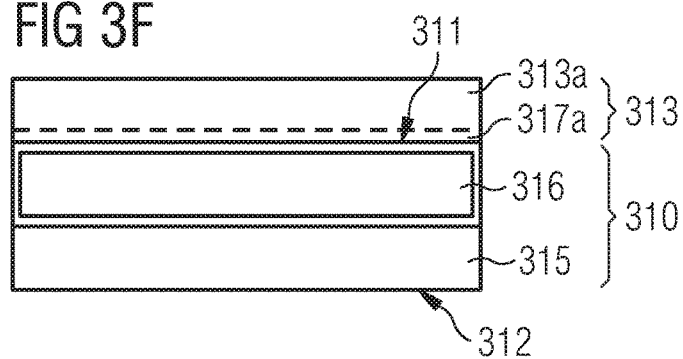
Figure 3G:
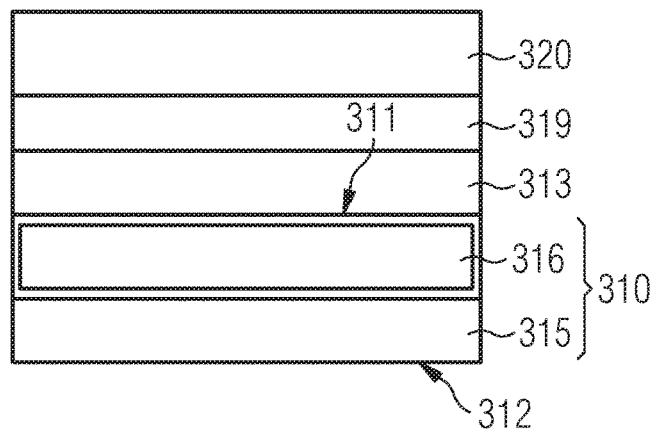

The compound wafer is further processed in FIG. 3G by one or more process steps such as forming doping regions for different semiconductor structures or forming a front metallization 319 to provide one or more electrical contacts.

Front side processing may include formation of one or more doping regions, and particularly forming at least one pn-junction in the semiconductor device layer 313. Front side processing may also include formation of a front side metallization and/or formation of at least one insulation layer which is at least partially arranged between the semiconductor device layer 313 and the front side metallization. In addition to that, or alternatively, front side processing can also include formation of trenches in the semiconductor device layer 313 and formation of electrode structures in one or more of the trenches.

Figure 3H:
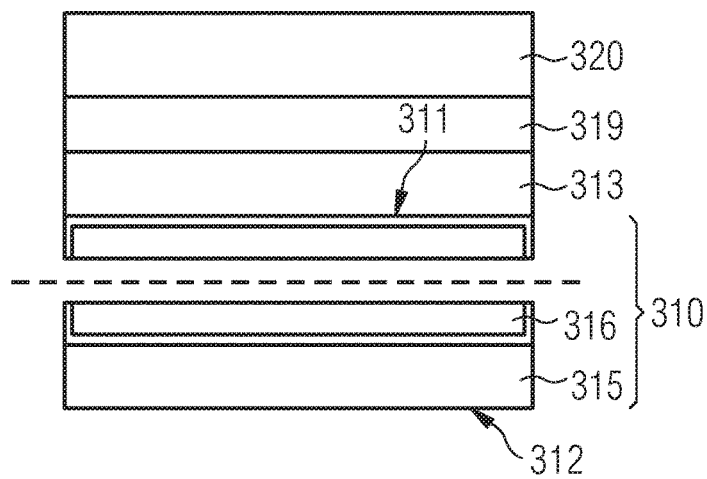

According to one or more embodiments, after front side processing the compound wafer is cut in FIG. 3H as described in FIG. 2D and remaining material of the separation layer 316 on the semiconductor device layer 313 is removed. For example, cutting can include sawing using a sawing tool that has a thickness which is less than the thickness of the separation layer 316 to avoid damaging the mechanical carrier 315 and the semiconductor device layer 313. The thickness of the separation layer 313 can be, relative to the thickness of the cutting tool, about at least 10% or larger. For practical use, an additional thickness of about 50 µm is often sufficient. The thicker the separation layer 316, the less likely is that any of the mechanical carrier 315 or the semiconductor device layer 313 is damaged. The separation layer 316 can also be thinner than the thickness of the cutting tool. For example, if water jet cutting is used, the thickness of the separation layer 316 can be less than the thickness of the water jet.

To provide the semiconductor device layer 313 with a sufficient mechanical stability during and after cutting, a front carrier 320 can be releasably bonded to the semiconductor device layer 313 prior to cutting.

Since the material of the separation layer 316 can be softer or mechanically less stable than the material of the mechanical carrier, the cutting consumes only little time. Furthermore, the cutting tool is less worn. Furthermore, the cutting is more reliable since a soft material is cut.

As described above, the cutting is carried out along a plane extending between the semiconductor device layer 313 and the mechanical carrier 315. The cutting plane is parallel to the semiconductor device layer 313 so that the semiconductor material of the carrier wafer 315 or of the semiconductor device layer 313 is not cut.

Since the mechanical carrier 315 is removed, the front carrier 320 can provide the mechanical stability of the wafer if the semiconductor device layer 313 is not stable enough.

Figure 3I:
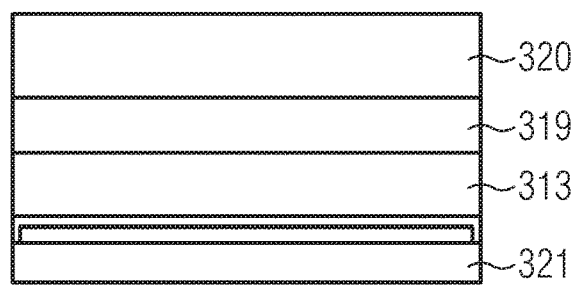

With reference to FIG. 3I, backside processing of the semiconductor device can be done such as forming doping regions, forming one or more back side layers 321, which can be a metallization layer or a passivation layer, or forming other types of necessary layers or structures depending on the semiconductor device.

With reference to FIG. 4A to 4I, another embodiment of the method of manufacturing a semiconductor device is illustrated.

Figure 4A:
FIG. 4A to 4I illustrate processes of a method for manufacturing a semiconductor device according to an embodiment.
Figure 4B:
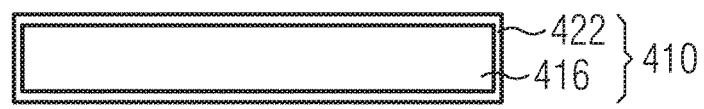

With reference to FIG. 4A, a core 416 is provided or prepared. The core 416 may be formed of graphite or carbon as described above.

In a further process, the surface of the core 416 is processed for preparing the core 416 for the subsequent bonding and the production process by adapting the surface properties and the bonding conditions. For example, the core 416 can be encapsulated with a protection layer 422, particularly by an oxygen-tight protection layer 422. Alternatively or in addition to that, the surface of the core 416 can be polished or grinded prior to forming the protection layer 422. According to an embodiment, the core 416 can include graphite or another material which is easy to cut by mechanical cutting or laser cutting in combination with oxygen.

Figure 4C:
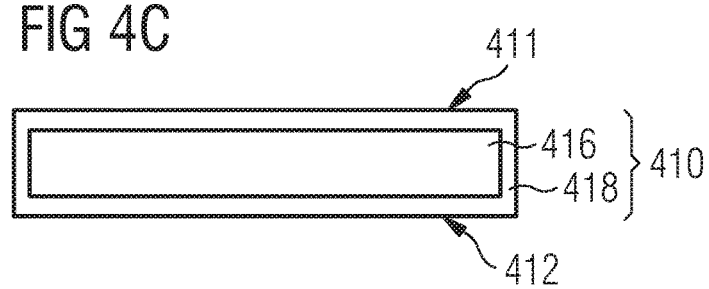

In FIG. 4C, the core 416 is coated with a coating 418, which can be a hard coating 418. According to one or more embodiments, the hard coating 418 provides mechanical stability if necessary and replaces the mechanical function of the mechanical carrier 215, 315. The core 416 and its coating 418, 422 are forming a carrier wafer 410 with a first side 411 and a second side 412.

According to an embodiment, the hard coating 418 is optionally formed after forming the protection layer 422 so that that hard coating 418 covers the protection layer 422. According to a further embodiment, the protection layer 422 is formed after forming the hard coating 418 so that the protection layer 422 covers the hard coating 418.

The hard coating 418 can also be formed only on one side of the core 416, for example on the side that faces away from the semiconductor device layer which is subsequently bonded to the core 416. Alternatively, the hard coating 418 is only formed on the bonding face facing the semiconductor device layer. The hard coating can also be formed on both sides and on the lateral edges of the core 416.

The hard coating 418 can be formed, for example, by deposition of a suitable material that stiffens the core 416. Suitable materials are, for example, SiC, pyrolytic graphite, silicon, nitride, metal oxide, and silicide.

Typically, the hard coating 418 has a thickness in a range between 1 µm and 50 µm, and more particularly between 2 µm and 20 µm.

In addition to covering the surface of the core 418, or of the protection layer 422, the material of the hard coating 418 may also penetrate into pores and openings of the core 416 which further increases the stiffness and mechanical stability of the core 416.

After depositing the material of the hard coating 418, and optional thermal anneal can be carried out, for example at a temperature of between 900° C. and 2000° C. for 1 min to 300 min.

Different the embodiment of FIGS. 3A to 3I, the core 416, which forms a thick separation layer, is not further supported by a mechanical carrier. Sufficient mechanical stability is achieved by increasing the thickness of the core 416 in comparison to the separation layer of FIGS. 3A to 3I, and by forming the optional hard coating 418. The core 416 can have a thickness between 250 µm and 1000 µm, and particularly between 350 µm and 800 µm. A specific example is 400 µm.

The core 416, together with the optional protection layer 422 and the optional hard coating 418, forms a carrier wafer 410.

According to one or more embodiments of the method, the hard coating 422 of the core 416 is on the first side 411 of the carrier wafer 410 or on the second side 412 of the carrier wafer 410 or completely encapsulating the core 416.

As illustrated in FIG. 4D to 4G, a compound wafer is formed in a way similar as described in FIGS. 3D to 3G wherein the separation layer 216 and the mechanical carrier 215 are replaced by the core 416 and its optional hard coating 418.

Figure 4D:
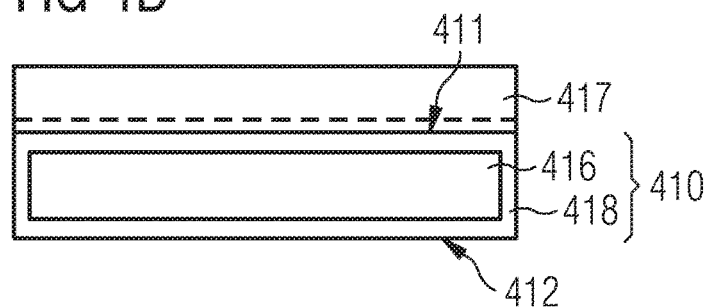
Figure 4E:
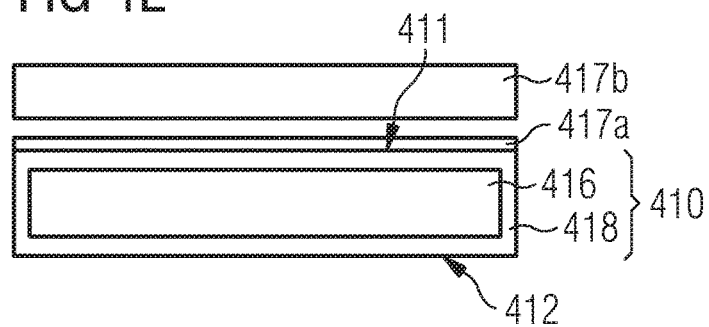
Figure 4F:
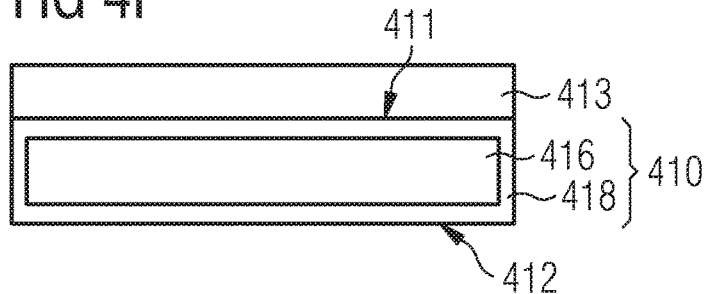

As described in connection with FIGS. 3D to 3G, a donor wafer 417 is provided having a delamination layer, which is indicated by the dashed line in FIG. 4D. The donor wafer 417 is bonded to the carrier wafer 410 and subjected to a thermal treatment for delaminating a thin starting layer 417a. The remaining part 417b of the donor wafer is reused.

The donor wafer 417 can be bonded to the hard coating 418 or to the protection layer 422 depending which of these layers is exposed. Any of the above described bonding processes can be used. For example, an additional bonding layer can be formed on either of the donor wafer 417 or the core 416, or on both.

As described above, an epitaxial layer can then be deposited onto the thin starting layer 417a to form a semiconductor device layer 413.

Figure 4G:
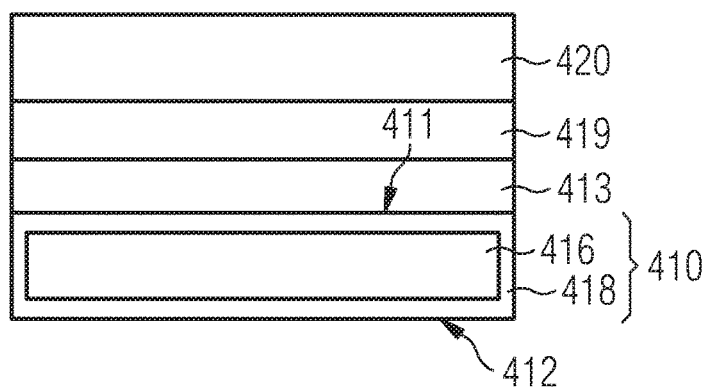

FIG. 4G illustrates a further process including formation of front metallization 419 on the semiconductor device layer 413 as described above.

Figure 4H:
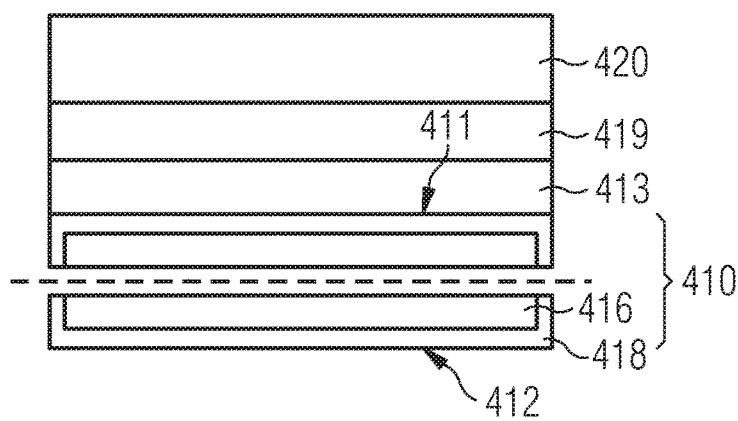

An optional carrier 420 can be temporarily attached to the front metallization 419 to provide mechanical support for the subsequently cutting through the core 416 as illustrated in FIG. 4H. The cutting is carried out along a plane which is parallel to, and between, the two main surfaces of the core 416 without damaging the semiconductor device layer 413. If there is remaining material of the carrier wafer 410 on the semiconductor device layer 413, it can be removed by polishing, grinding, etching or a combination thereof.

Figure 4I:
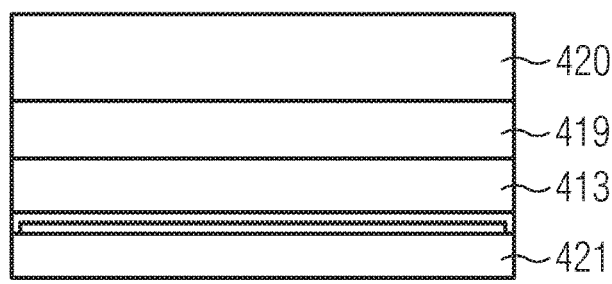

With reference to FIG. 4I, backside processing can be done such as forming doping regions, forming one or more back side layers 421, which can be a metallization layer or a passivation layer, or forming other types of necessary layers or structures depending on the semiconductor device. More particularly, a backside metallization 421 can be formed after the carrier wafer 416 has been removed. Typically, the material of the carrier wafer 416 including the material of the hard coating 418 and of the protection layer 422 is completely removed from the backside of the semiconductor device layer 413, and then the backside metallization 421 is formed.

Subsequently, the layer stack including the semiconductor device layer 413, the front side metallization 419 and the backside metallization 421 are diced to form separate semiconductor chips as described further above.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device, the method comprising:
providing a carrier wafer comprising a first side and a second side opposite the first side;
implanting gas ions into a first side of a donor wafer to form a delamination layer;
bonding the first side of the donor wafer to the first side of the carrier wafer to form a compound wafer;
subjecting the compound wafer to a thermal treatment to cause separation along the delamination layer of the donor wafer, leaving a starting layer bonded to the carrier wafer;
growing an epitaxial layer on the starting layer to form a semiconductor device layer; and
separating the compound wafer by cutting the carrier wafer along a plane between the first side and the second side of the carrier wafer, the method further comprising:
bonding a separation layer to a mechanical carrier to form the carrier wafer,
wherein the separation layer is arranged between the mechanical carrier and the semiconductor device layer after the epitaxial layer is grown on the starting layer, and
wherein cutting the carrier wafer comprises cutting the separation layer of the carrier wafer.

2. The method of claim 1, wherein the delamination layer formed by implanting gas ions comprises a micro-bubble layer or a micro-porous layer.

3. The method of claim 1,
wherein subjecting the compound wafer to the thermal treatment causes separation of the donor wafer into the starting layer and a second portion, and
wherein the method further comprises removing the second portion.

4. The method of claim 1,
wherein the epitaxial layer includes silicon carbide, and wherein the starting layer includes silicon carbide.

5. The method of claim 1, further comprising:
forming trenches in the semiconductor device layer; and
forming electrode structures in one or more of the trenches.

6. The method of claim 1, wherein the mechanical carrier comprises a monocrystalline material, a polycrystalline material, an amorphous material, or a combination thereof.

7. The method of claim 1, wherein bonding the mechanical carrier to the separation layer comprising bonding the mechanical carrier to the separation layer by pre-ceramic polymer bonding using allyl-hydrido-polycarbosilane, glue, thermic bond, or an electrically conductive adhesive.

8. The method of claim 1, wherein the separation layer is encapsulated by an electrically conductive oxygen-tight protection layer or an electrically insulating oxygen-tight protection layer.

9. The method of claim 1, wherein the carrier wafer comprises a core and wherein a material of the core or of the separation layer comprises graphite.

10. The method of claim 1, wherein the carrier wafer comprises a core and a coating, the coating being at least one of an oxygen-tight coating or a hard coating, and wherein cutting the carrier wafer comprises cutting the core of the carrier wafer.

11. The method of claim 1, wherein the carrier wafer comprises a core, the method further comprising:
forming an oxygen-tight protection layer to encapsulate the core; and
forming a hard coating on the oxygen-tight coating;
wherein cutting the carrier wafer comprises cutting the core of the carrier wafer.

12. The method of claim 1, further comprising at least one of:
forming a doping region in the semiconductor device layer of the compound wafer prior to separating the compound wafer; or forming a doping region in the semiconductor device layer at a side of the semiconductor device layer facing the carrier wafer.

13. The method of claim 1, the method further comprising subjecting the compound wafer to a temperature treatment at a temperature of at least 500° C.

14. The method of claim 1, wherein cutting the carrier wafer comprises sawing, water jet cutting, or laser cutting the carrier wafer.

15. The method of claim 1, further comprising removing material of the carrier wafer remaining on the semiconductor device layer after cutting the carrier wafer.

16. The method of claim 1, further comprising forming a metallization on the semiconductor device layer prior to separating the compound wafer.

17. The method of claim 1, further comprising dicing the semiconductor device layer to form semiconductor chips.

18. A method for manufacturing a semiconductor device, the method comprising:
providing a carrier wafer comprising a first side and a second side opposite the first side;
implanting gas ions into a first side of a donor wafer to form a delamination layer, wherein the donor wafer comprises silicon carbide, and wherein the delamination layer comprises a micro-bubble layer or a microporous layer;
bonding the first side of the donor wafer to the first side of the carrier wafer to form a compound wafer;
subjecting the compound wafer to a thermal treatment to cause separation along the delamination layer of the donor wafer, causing the donor wafer to separate into a starting layer and a second portion, wherein the starting layer is bonded to the carrier wafer;
removing the second portion of the donor wafer;
growing an epitaxial layer comprising silicon carbide on the starting layer to form a semiconductor device layer; and
separating the compound wafer by cutting the carrier wafer along a plane between the first side and the second side of the carrier wafer, the method further comprising:
bonding a separation layer to a mechanical carrier to form the carrier wafer,
wherein the separation layer is arranged between the mechanical carrier and the semiconductor device layer after the epitaxial layer is grown on the starting layer, and
wherein cutting the carrier wafer comprises cutting the separation layer of the carrier wafer.

19. A method for manufacturing a semiconductor device, the method comprising:
encapsulating a separation layer with an oxygen-tight protection layer;
bonding the separation layer to a mechanical carrier to form a carrier wafer comprising a first side and a second side opposite the first side;
implanting gas ions into a first side of a donor wafer to form a delamination layer, wherein the donor wafer comprises silicon carbide, and wherein the delamination layer comprises a micro-bubble layer or a microporous layer;
bonding the first side of the donor wafer to the first side of the carrier wafer to form a compound wafer;
subjecting the compound wafer to a thermal treatment to cause separation along the delamination layer of the donor wafer, causing the donor wafer to separate into a starting layer and a second portion, wherein the starting layer is bonded to the carrier wafer;
removing the second portion of the donor wafer for reuse in manufacturing further starting layers of other compound wafers;
growing an epitaxial layer comprising silicon carbide on the starting layer to form a semiconductor device layer;
forming a metallization layer on a first side of the semiconductor device layer opposite the carrier wafer prior to separating the compound wafer; and
separating the compound wafer by cutting the separation layer.

* * * * *